(12) United States Patent
Akerib et al.

(10) Patent No.: US 9,653,166 B2
(45) Date of Patent: May 16, 2017

(54) IN-MEMORY COMPUTATIONAL DEVICE

(71) Applicant: GSI Technology Inc., Sunnyvale, CA (US)

(72) Inventors: Avidan Akerib, Tel Aviv (IL); Eli Ehrman, Beit Shemesh (IL)

(73) Assignee: GSI Technology Inc., Sunnyvale, CA (US)

( * ) Notice: Subject to any disclaimer, the term of this patent is extended or adjusted under 35 U.S.C. 154(b) by 0 days.

(21) Appl. No.: 15/206,278

(22) Filed: Jul. 10, 2016

(65) Prior Publication Data

US 2016/0322106 A1 Nov. 3, 2016

Related U.S. Application Data

(63) Continuation of application No. 14/555,638, filed on Nov. 27, 2014, now Pat. No. 9,418,719.

(60) Provisional application No. 61/910,068, filed on Nov. 28, 2013.

(51) Int. Cl.
*G11C 7/00* (2006.01)
*G11C 15/04* (2006.01)
*G11C 8/10* (2006.01)
*G11C 7/18* (2006.01)
*G11C 7/10* (2006.01)

(52) U.S. Cl.
CPC ............ *G11C 15/04* (2013.01); *G11C 7/1006* (2013.01); *G11C 7/1051* (2013.01); *G11C 7/18* (2013.01); *G11C 8/10* (2013.01); *G11C 7/1012* (2013.01)

(58) Field of Classification Search
CPC .................................................. G11C 7/1006
USPC ..................................................... 365/189.17
See application file for complete search history.

(56) References Cited

U.S. PATENT DOCUMENTS

| | | | | |
|---|---|---|---|---|
| 6,137,730 A * | 10/2000 | Chien | ...................... | G11C 7/18 365/189.02 |
| 6,937,535 B2 * | 8/2005 | Ahn | ......................... | G11C 7/18 365/189.04 |
| 7,002,864 B2 * | 2/2006 | Kim | ...................... | G11C 11/406 365/205 |
| 7,088,637 B2 * | 8/2006 | Ko | ........................ | G11C 7/1051 365/185.21 |
| 7,230,869 B1 * | 6/2007 | Redgrave | ................. | G11C 7/06 365/189.18 |
| 7,505,298 B2 * | 3/2009 | Yang | ........................ | G11C 7/12 365/189.02 |

* cited by examiner

*Primary Examiner* — Son Mai

(74) *Attorney, Agent, or Firm* — Eitan, Mehulal & Sadot

(57) ABSTRACT

A computing device includes a memory array built of several sections having memory cells arranged in rows and column, at least one cell in each column of the memory array being connected to a bit line; and at least one multiplexer to connect a bit line in a first column of a first section to a bit line in a second column in a second section different from the first section, where the second column is not continuous with the first column; and a decoder to activate at least two word lines of the first section and a word line connected to a cell in the second column in the second section to write a bit line voltage associated with a result of a logical operation performed on the first column into the cell in the second column.

20 Claims, 4 Drawing Sheets

IN-MEMORY COMPUTATIONAL DEVICE

CROSS-REFERENCE TO RELATED APPLICATIONS

This application is a continuation application claiming benefit from U.S. patent application Ser. No. 14/555,638, filed Nov. 27, 2014, which claims priority and benefit from U.S. provisional patent application Ser. No. 61/910,068, filed Nov. 28, 2013, both of which are hereby incorporated by reference in their entirety.

FIELD OF THE INVENTION

The present invention relates to computing devices in general, and more particularly to a device and a method used for search and/or computational operations.

BACKGROUND OF THE INVENTION

Memory arrays, which store large amounts of data, are known in the art. Over the years, manufacturers and designers have worked to make the arrays physically smaller but the amount of data stored therein larger.

Computing devices typically have one or more memory array to store data and a central processing unit (CPU) and other hardware to process the data. The CPU is typically connected to the memory array via a bus. Unfortunately, while CPU speeds have increased tremendously in recent years, the bus speeds have not increased at an equal pace. Accordingly, the bus connection acts as a bottleneck to increased speed of operation.

U.S. Pat. No. 8,238,173 to Akerib et al. and assigned to the common assignee of the present invention discloses a processor which may perform in-memory computations. The processor includes a memory array to store data, and an activation unit to activate at least two cells in a column of the memory array at generally the same time to generate a Boolean function output of the data of the at least two cells. The Boolean function output may then be stored inside the memory array for further processing, including to generate new Boolean function outputs. This operation may be repeated numerous times until the desired results are achieved. The results may then be output for further use. Also disclosed therein is a content addressable memory (CAM) unit, including a ternary CAM (T-CAM) unit which may be implemented using the principles of operation of the in-memory processor.

SUMMARY OF THE PRESENT INVENTION

There is provided, in accordance with an embodiment of the present invention, a computing device including a memory array, at least one multiplexer and a decoder. The memory array has a plurality of sections with memory cells arranged in rows and column. At least one cell in each column of the memory array is connected to a bit line. The at least one multiplexer connects a bit line in a first column of a first section to a bit line in a second column in a second section, different from the first section, where the second column is not continuous with the first column. The decoder activates at least two word lines of the first section and a word line connected to a cell in the second column in the second section to write a bit line voltage associated with a result of a logical operation performed on the first column into the cell in the second column.

In addition, in accordance with an embodiment of the present invention, the computing device includes a controller to provide the decoder with an instruction set for decoding. The instruction set may be small or it may comprise a maximum size of 64 bits.

Moreover, in accordance with an embodiment of the present invention, the instruction set represents compressed data associated with the operation of the memory array, the multiplexer(s) and the decoder.

Furthermore, in accordance with an embodiment of the present invention, the decoder decompresses the compressed data. The decoder also activates at least one multiplexer to connect the bit lines in the first section and the second section. The decoder simultaneously accesses several read word lines and write word lines in the memory array.

Moreover, in accordance with an embodiment of the present invention, the decoder decodes the instruction set from the controller into an instruction set for accessing in parallel several read word lines and write word lines in the memory array.

Furthermore, the decoder includes a memory array comprising a plurality of memory cells arranged in rows and column. At least one cell in each column is connected to a bit line having a bit line voltage associated with a logical 1 or a logical 0 and the activation of the word line is through the bit line in the decoder.

Still further, in accordance with an embodiment of the present invention, the at least one cell connected to a bit line includes only one memory cell in each column or includes all the memory cells in each column.

Moreover, in accordance with an embodiment of the present invention, the memory cells are non-destructive cells, volatile memory cells or any combination of cells.

There is provided, in accordance with an embodiment of the present invention, a method of performing in-memory computations in a memory array which has a plurality of sections having memory cells arranged in rows and column, at least one cell in each column of the memory array being connected to a bit line. The method includes connecting a bit line in a first column of a first section to a bit line in a second column in a second section different from the first section where the second column is not continuous with the first column; and activating at least two word lines of the first section and a word line connected to a cell in the second column in the second section to write a bit line voltage associated with a result of a logical operation performed on the first column into the cell in the second column.

In addition, in accordance with an embodiment of the present invention, the method includes decompressing compressed data represented by a small size instruction set into a large size instruction set. In addition, the method further includes simultaneously accessing a plurality of read word lines and write word lines.

Moreover, in accordance with an embodiment of the present invention, the method includes decoding an instruction set from a controller into an instruction set comprising a plurality of read and write commands. The method also includes activating the word line with a bit line voltage.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
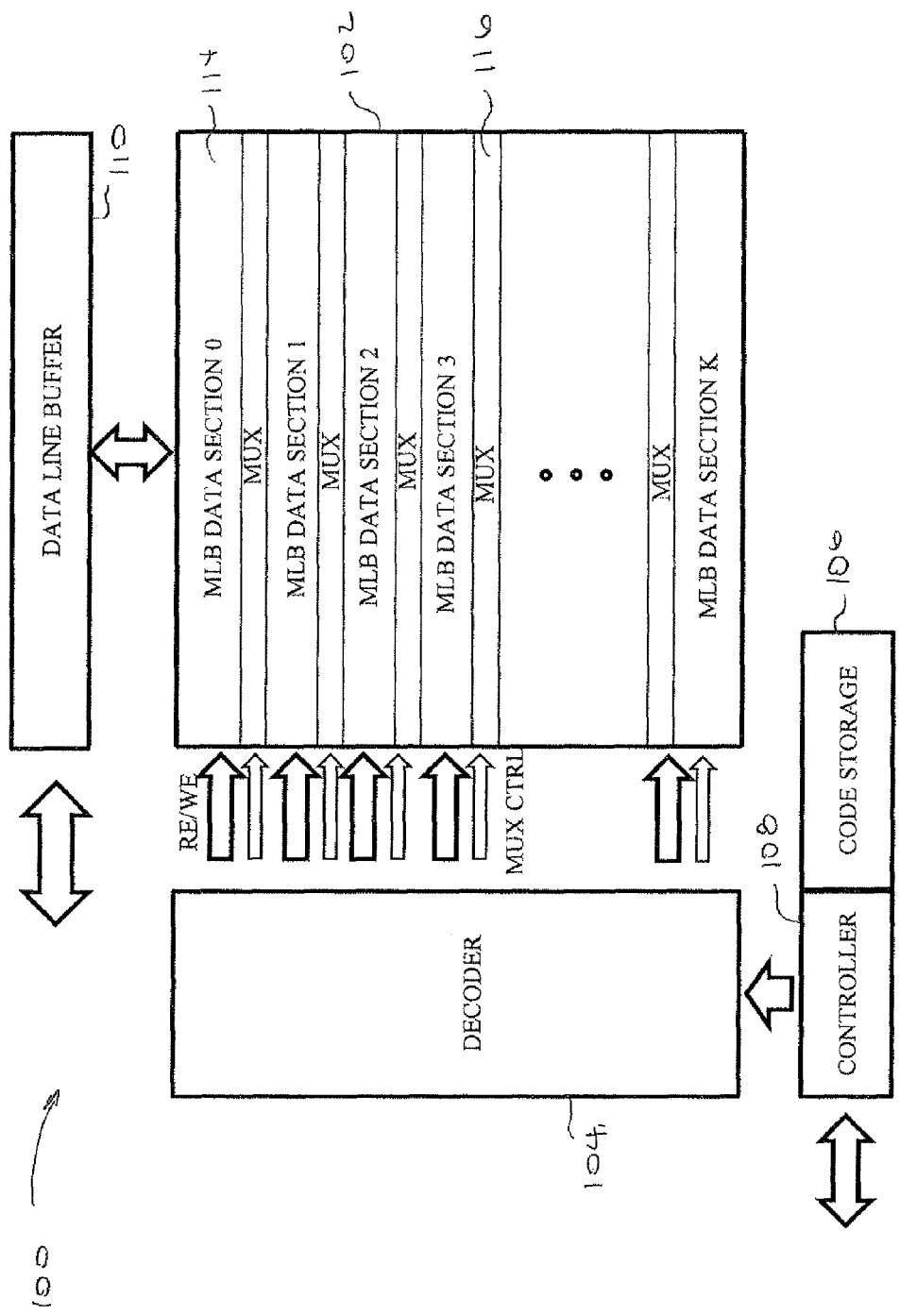
FIG. 1 schematically illustrates an exemplary in-memory computational device, according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that the performance of devices which use in-memory computations may be vastly improved by dividing the device's memory into blocks of memory cells which may be individually accessed and which in parallel may carry out different operations. Applicants have additionally realized that performance may be further improved by using the results of the operations carried out in a memory logic block (MLB), as a block of memory cells will be referred to hereinafter, in other MLBs to perform other operations, without first having to output the result of each operation and rewriting them into memory for use by the other MLBs Only when the desired final result is obtained is the data output from memory.

Applicants have realized that an in-memory computational device which can perform in-memory computations as described above may require a decoder which can decode controller instruction sets in known size formats (8 bit, 16 bit, 32 bit, 64 bit, etc.) into an instruction set of hundreds and even thousands of bits with which to access, in parallel, the numerous number of rows of cells in the MLBs In effect, the decoder should be able to decode the "small size" controller instructions which may represent compressed code into decompressed "large size" read/write instructions to activate the MLB cells.

It may be appreciated that an in-memory computational device as described above, which may execute a multiplicity of different operations in parallel, may operate as a MIMD (multiple instructions, multiple data) machine. It may be further appreciated that the in-memory computational device may also operate as an SIMD (single instruction, multiple data) machine, the selection to operate as a MIMD or a SIMD defined in the controller instructions.

It may also be appreciated that an in-memory computational device as described above may find numerous applications in diverse field which may require search and/or compute operations. These may include database and storage applications including distributed storage and cloud storage, signal processing including image and audio processing, biometrics, data compression, communications network switching, caching applications, among many others, some of which may include CAM and T-CAM operations.

Reference is made to FIG. 1 which schematically illustrates an exemplary in-memory computational device 100, according to an embodiment of the present invention. Device 100 may include a memory logic block (MLB) 102, a decoder 104, a code storage unit 106, a controller 108, and a data line buffer 110.

MLB 102 may include a plurality of MLB data sections 114, shown in the figure as MLB DATA SECTION 0 to MLB DATA SECTION K, and a plurality of multiplexer units (MUX) 116, each multiplexer unit interconnecting two MLB data sections 114 located one above the other. MLB 102 may include any number of MLB data sections 114, the number generally limited by physical constraints associated with chip design, or by electrical constraints associated with the operation of sensing circuitry and/or driver circuitry, among other possible constraints. Applicants have determined that between 16 to 64 MLB data sections 114 may be used satisfactorily in MLB 102, although operation with lesser or greater numbers of MLB data sections may still be satisfactory.

Figure 2:
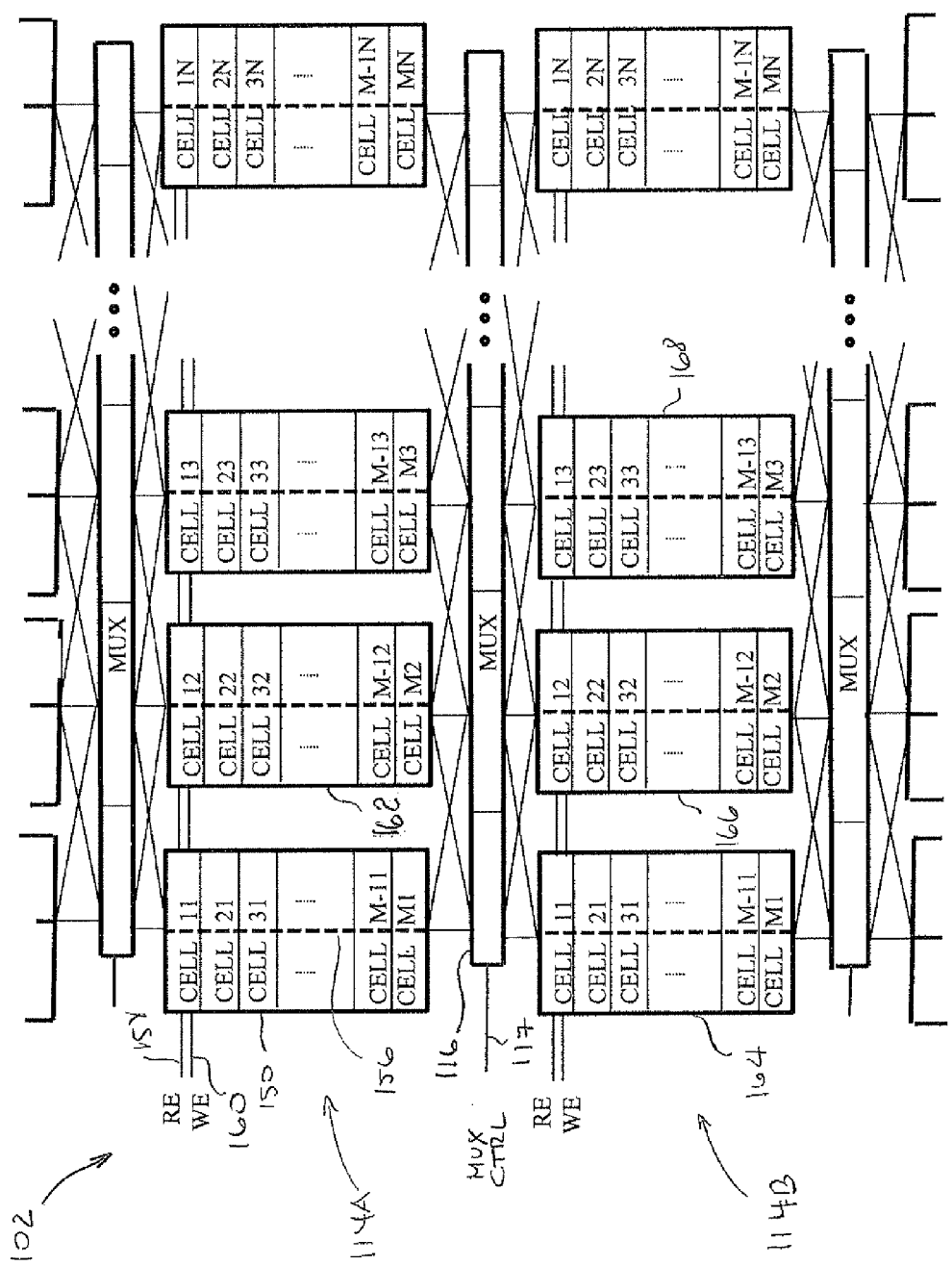
FIG. 2 schematically illustrates a section of an MLB in FIG. 1 including two exemplary MLB data sections interconnected by a multiplexer, according to an embodiment of the present invention.

Reference is now also made to FIG. 2, which schematically illustrates a section of MLB 102 including two exemplary MLB data sections 114 (designated 114A and 114B respectively in the figure) interconnected by MUX 116, according to an embodiment of the present invention. As may be appreciated from the figure, MLB data sections 114A and 114B each include a plurality of memory cells 150 arranged in M rows and N columns. The number of cells in each row and in each column, as previously described with reference to MLB 102, may generally be limited by physical constraints associated with chip design, or by electrical constraints which may be associated with sensing circuitry, precharge circuitry and/or driver circuitry operation, among other possible constraints. Applicants have determined that 16 memory cells may be used satisfactorily in each MLB data section 114, although operation with lesser or greater numbers of cells may still be satisfactory.

The architecture of MLB 102, including MLB data section 114A and 114B, may resemble that of a NOR-type memory array (for NOR Boolean operations), or alternatively, that of a NAND-type memory array (for NAND Boolean operations). It is well known that NOR functions may be combined to generate the same results as NAND functions, and the inverse. Therefore, with reference to the present invention, Applicants understand that the skilled person practicing the invention may use either type of architecture.

Cells 150 may each be identified by the letter "C" followed by the row and column in which it is located in the MLB data section. For example, cells 150 in the first row and located in the 1 to Nth column are designated C11, C12, C13, to C1N, respectively. Similarly cells 150 located in the second row and third row, as shown, are designated C21, C22, C23, to C2N, and C31, C32, C33, to C3N, respectively. Cells 150 in the Mth row are designated CM1, CM2, CM3, to CMN, respectively.

Each cell 150 in a row may be connected to a read word line 158 (RE) and a write word line 160 (WE) through which each cell in the row may be activated for reading and writing respectively. Each cell 150 in a column may be connected to a bit line 156.

Cells 150 may include volatile memory cells or non-destructive (non-volatile) memory cells, or a combination of both. The volatile memory cells may be implemented using SRAM or DRAM technologies or other volatile memory technologies. The non-destructive cells may be implemented using non-volatile memory (NVM) technologies such as ReRAM, MRAM, STT-RAM, T-RAM, PC-RAM, nvS-RAM, SONOS, Z-RAM, FeRAM, NRAM, among other NVM technologies and memristor technologies known in the art, or which may be under development, or yet to be developed, and may also include flash memory technologies (e.g. floating gate, etc.).

MUX 116 may connect bit line 156 in a column of an MLB data section 114 with bit lines 156 of one or more columns in the MLB data section above or below. In one embodiment, MUX 116 may connect bit line 156 in one column to a bit line in one of three columns in the section above or below, although it may be appreciated that the number of bit line connections varies with the design of MUX 116, and may include less than or more than three connection. The columns to which bit line 156 may connect through MUX 116 may include that directly above, or below, the bit line, and the adjacent column on each side. For example, MUX 116 may connect cell column 162 in MLB data section 114A with cell columns 164, 166, and 168. Through MUX 116, a voltage charge (data) on bit line 156 in cell column 162 may be transferred to bit line 156 in any one of columns 164, 166, 168, or the inverse.

It may be appreciated that MUXs 116 may be used to transfer data between MBL data sections 114 within a same MBL or different MBLs (in devices with multiple MBLs shown in FIG. 4), or both, without having to output the data from memory and rewriting into memory. That is, by activating one or more MUXs 116, the data result of an operation performed in a column, may be transferred from the column in one MLB data section to one or more columns in other MLB data sections in the same MLB or other MLBs As an example, to write the result of a NAND or NOR operation performed in column 168 in MLB data section 114B to cell C32 (column 162) in MLB data section 114A, MUX 116 connects (responsive to a command) bit line 156 in column 162 to bit line 156 in column 168 so that the two bit lines are now at substantially the same potential (a logical "0" or "1"). Write word line 160 connecting to C32 in MLB data section 114A is activated (write enabled) and the data on bit line 156 is written into C32. The data written into C32 in MLB data section 11A 114A may be used to perform a Boolean operation in column 168.

MUXs 116 may also be used to distribute data arriving from a host connected to device 100 through data line buffer 110 to memory cells 150. Additionally, MUXs 116 may be used to direct output data results through MLB data sections 114 to data line buffer 110, and therefrom to the host.

Decoder 104 may receive instructions sets in known size formats (e.g. 8 bit, 16 bit, 32 bit, 64 bit) from controller 108 and may decode the instructions into an instruction set of hundreds or thousands, and possibly tens of thousands, read and write instructions, and MUX 116 operation instructions. The instructions generated by decoder 104 may be applied, in parallel, to the rows of cells 150, and to MUXs 116, in MLB 102.

Decoder 104 may be implemented in a NOR-type memory array, or alternatively a NAND-type memory array, and may be able to perform in-memory computations including generation and combination of NOR and NAND Boolean functions. Decoder 104 may additionally use results of operations without having to output the results and rewrite them into the decoder. The output results may be the instructions to MLB 102. In some embodiments, the architecture of decoder 104 may resemble that of an MLB 102, and may be divided into sections resembling a MLB data section 114. Multiplexers may be included, but may not be necessary, and may depend on the number of rows of cells in the decoder.

Figure 3:
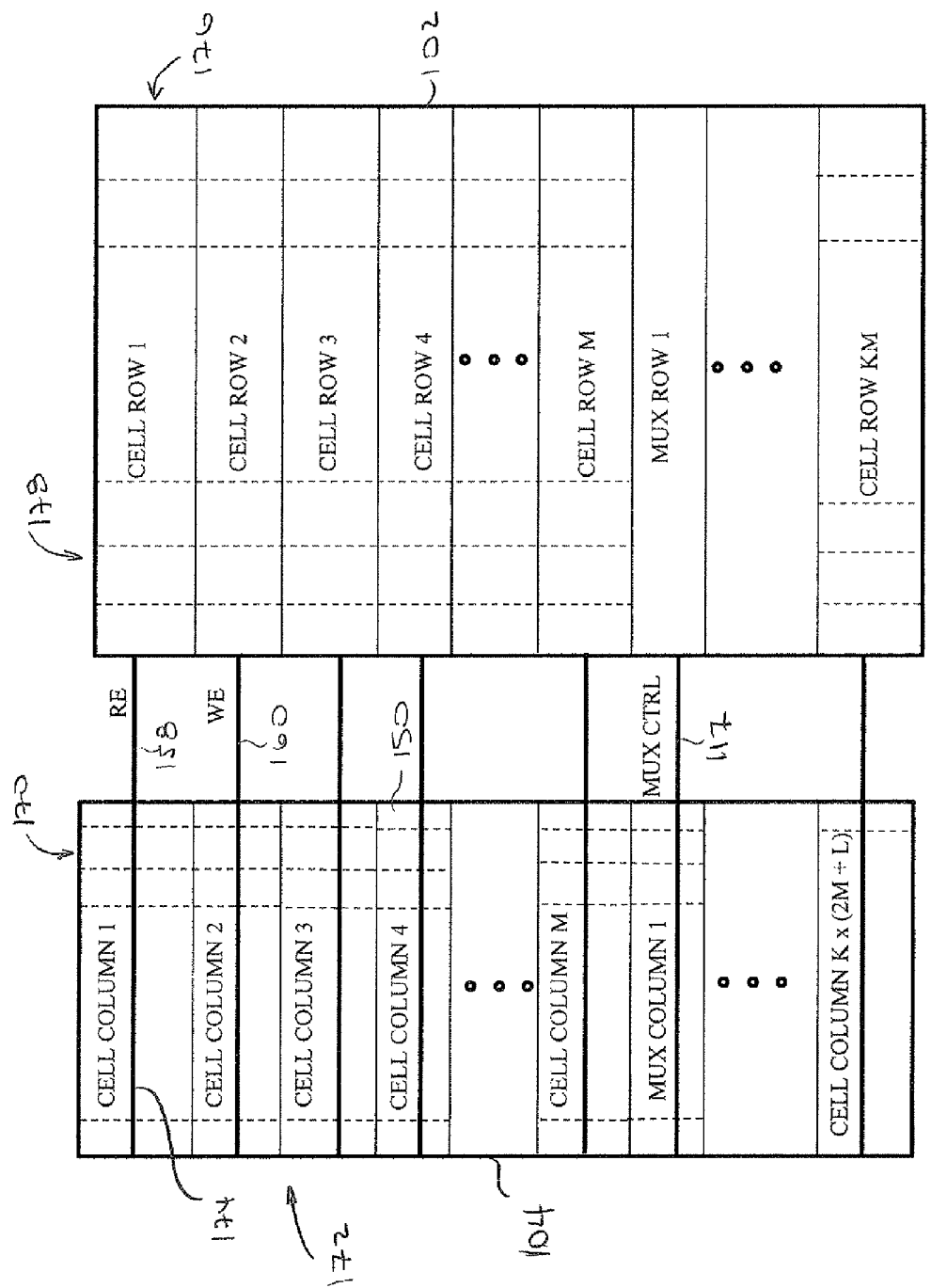
FIG. 3 schematically illustrates an exemplary arrangement of memory cells in rows and columns in a decoder shown in FIG. 1, according to an embodiment of the present invention.

Reference is now also made to FIG. 3 which schematically illustrates an exemplary arrangement of memory cells 150 in rows 170 and columns 172 in decoder 104, according to an embodiment of the present invention.

Decoder read and write instructions and MUX control signals are output from the decoder through bit lines 174 in each column, one bit line for every read word line 158, one for every write word line 160, and one for every MUX control line 117, in MLB 102. Therefore, a minimum number of columns 172 required may be determined by the following equation:

$$COL=2*CM*K+K*L;$$

where COL=number of columns 172, CM=number of cells in an MLB data section 114 (multiplied by 2, one bit line for read word line 158, and one bit line for write word line 160), K=number of MLB data sections in MLB 102, and L=number of multiplexed columns per bit line. Other columns 172 may be required to provide for additional bit lines 174 as may be required for other operations, for example, for MLB 102 data input/output through data line buffer 110, which may require a multiplexer to connect the buffer to the first MLB data section (i.e. K*L may be replaced by (K+1)*L).

For example, assuming that MLB 102 has 64 MLB data sections 102 and each MLB data section has 16 cells 150 in each column, each MUX 116 connects multiplexes 3 columns to every column, then:

$$COL=2*16*64+64*3=2115;$$

that is, at least 2115 columns 172 are required in decoder 104 to connect to MLB 102, and 2018 if a multiplexer is to be used to connect data line buffer 110 to MLB data section 0.

As may be appreciated from the figure, cell rows 170 and columns 172 in decoder 104 may be oriented perpendicularly to cell rows 176 and columns 178 in MLB 102 to facilitate the connection between the bit line outputs from the decoder with the input lines (read word lines 158, write word lines 160, and MUX control lines 117). This may be potentially advantageous in the design of the layout of the chip of device 100 as decoder 104 may be placed at substantially a right angle (90°) to MLB 102, possibly reducing space requirements.

The instructions from controller 108 may activate read and write lines (not shown) connecting cells 150 in rows 170. Responsive to the activation of the read and write lines, similarly to MLB 102, Boolean operations may be performed in columns 172 and the results stored in cells 150 of other columns 172 for performing other Boolean operations. Only the desired final result, which may be the instruction set for MLB 102, may be output.

A number of rows 170 in decoder 104 may correspond to, but not be limited to, the width of the bus of controller 108, but may be more or less. For example, if the width of the bus is 64 bits, then the number of rows 170 may also be 64 rows, although it may also be 32 rows. Alternatively, if the width of the bus is 32 bits, the number of rows 170 may be 64 rows. Whichever may be the case, decoder 104 may include suitable firmware including appropriate buffering as may be required to transfer the controller instructions into the decoder.

As previously mentioned, decoder 104 may be able to perform in-memory computations including generation of NAND and/or NOR Boolean functions, and may use results of operations without having to output the results and rewrite them into the decoder. The instruction sets from controller 108 may represent compressed data stored in code storage unit 106, and may be delivered to the decoder every clock cycle. The compressed data may include low level instructions which may specify how to perform Boolean operations, including NAND and/or NOR operations, the order of performing the operations, in which MLB data section to execute the operations, which MLB data section results are combined in which cycle, which MLB data section results are to be multiplexed, among other instructions for performing in-memory computations in MLB 102 to generate the desired output results.

It may be appreciated that decoder 104 decompresses the compressed data received from code storage unit 106 through controller 108 every clock cycle, converting the controller instruction sets of relatively small size into a much larger instruction set of decoded read/write instructions and MUX control instructions which are delivered in parallel to MLB 102. Each decoded instruction set may be delivered to MLB 102 in every clock cycle. It may be appreciated that a decoder which may receive small size controller instructions every clock cycle and may also output large set decoded instructions every clock cycle may be potentially advantageous as relatively little memory is required. For example, in the art, a function that requires 100 cycles to complete would require memory space to store approximately 20K signals (assuming approximately 2000 word lines in the MLB) The decoder of the present invention solves this problem as the required memory space may be that required to perform the computational operations to decompress the compressed code data.

Figure 4:
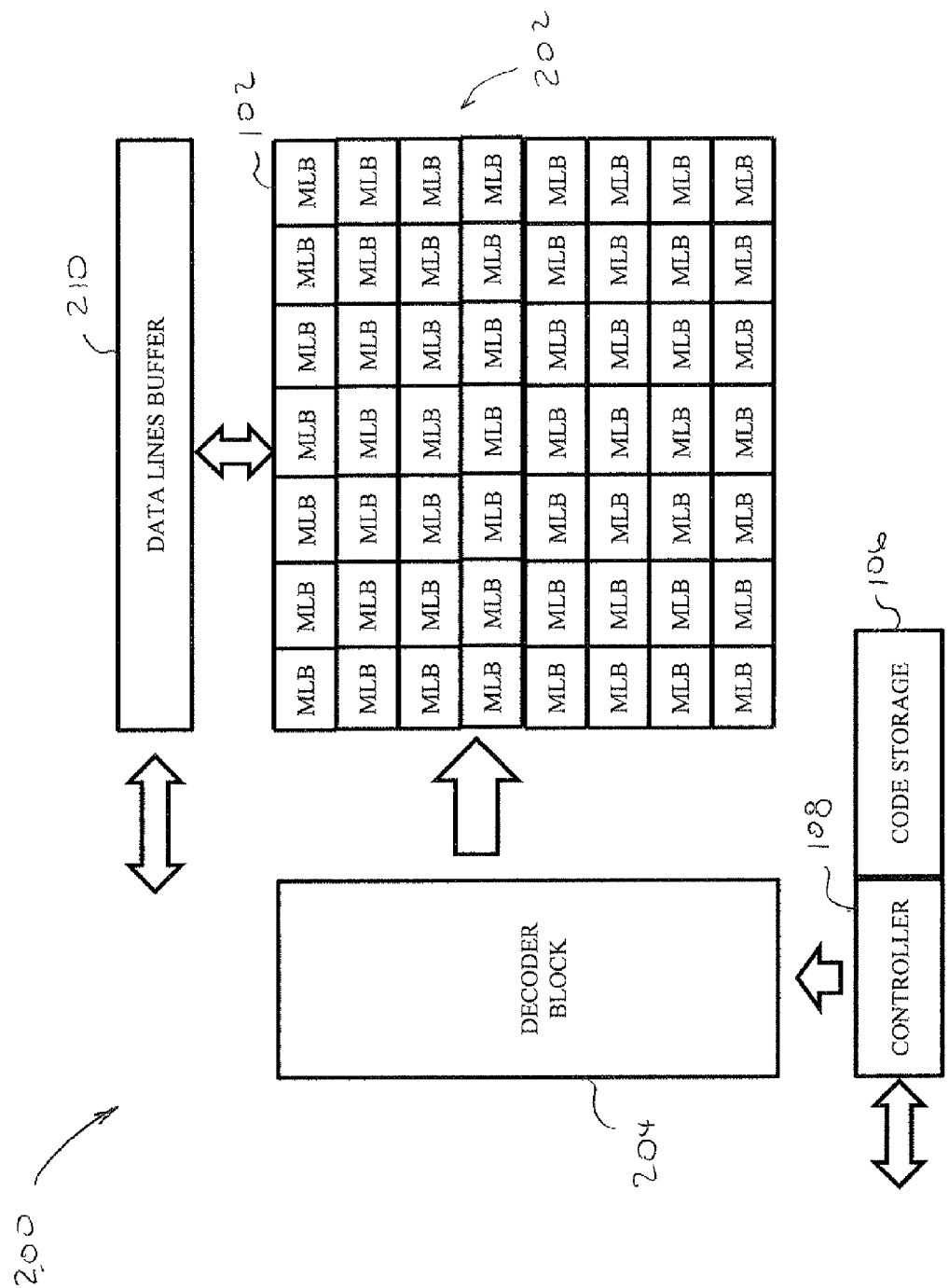
FIG. 4 schematically illustrates an exemplary in-memory computational device suitable for big data processing, according to an embodiment of the present invention.

Reference is now made to FIG. 4 which schematically illustrates an exemplary in-memory computational device 200, according to an embodiment of the present invention. Device 200 includes an MLB block 202 including a plurality of MLBs 102, a decoder block 204, code storage unit 106, controller 108, and data lines buffer 210. Device 200 may be functionally similar to device 100 shown in FIG. 1 and may also be suitable for performing big data search and computational operations in MLB block 202. Decoder 204 and data lines buffer 210 are functionally similar to decoder 104 and data line buffer 110 shown in FIG. 1 but may be scaled in size to enable manipulation and processing of the big data.

From the above discussion, it may be further appreciated that a small MIMD machine may be implemented in device 100 where many different operations may be carried out in parallel in MLB 102 by simultaneously providing different read and write instructions to the plurality of MLB data sections 114 (and by activating MUXs 116 accordingly so that the results of column operations in one MLB data section may be used in the operations of other MLB data sections. A larger MIMD machine may be implemented in device 200 by providing the different read and write instructions to the plurality of MLBs 102 and activating the MUXs accordingly. Furthermore, a small MIMD machine may be implemented in device 100 by simultaneously providing the same read and write instructions to the plurality of MLB data sections 114, and activating MUXs 116 accordingly. A large SIMD machine may be implemented in device 200 by providing the same read and write instructions to a plurality of MLBs 102 and activating MUXs 116 accordingly.

Unless specifically stated otherwise, as apparent from the preceding discussions, it is appreciated that, throughout the specification, discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROMs), compact disc read-only memories (CD-ROMs), random access memories (RAMs), electrically programmable read-only memories (EPROMs), electrically erasable and programmable read only memories (EEPROMs), magnetic or optical cards, Flash memory, or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:
1. A computing device comprising:
a memory array comprising a plurality of sections having memory cells arranged in rows and column, at least one cell in each column of said memory array being connected to a bit line; at least one multiplexer to connect a bit line in a first column of a first section to a bit line in a second column in a second section different from said first section, wherein said second column is not continuous with said first column; and
a decoder to activate at least two word lines of said first section and a word line connected to a cell in said second column in said second section to write a bit line voltage associated with a result of a logical operation performed on said first column into said cell in said second column.

2. A computing device according to claim 1 further comprising a controller to provide said decoder with an instruction set for decoding in said decoder.

3. A computing device according to claim 2 wherein said instruction set is of a small size.

4. A computing device according to claim 3 wherein said instruction set from said controller comprises a maximum size of 64 bits.

5. A computing device according to claim 2 wherein said instruction set represents compressed data associated with the operation of any one of said memory array, said at least one multiplexer, and said decoder.

6. A computing device according to claim 5 wherein said decoder decompresses said compressed data.

7. A computing device according to claim 1 wherein said decoder activates said at least one multiplexer to connect said bit lines in said first section and said second section.

8. A computing device according to claim 1 wherein said decoder simultaneously accesses a plurality of read word lines and write word lines in said memory array.

9. A computing device according to claim 2 wherein said decoder decodes said instruction set from said controller into an instruction set for accessing in parallel a plurality of read word lines and write word lines in said memory array.

10. A computing device according to claim 1 wherein said decoder comprises a memory array comprising a plurality of memory cells arranged in rows and column, at least one cell in each column connected to a bit line having a bit line voltage associated with a logical 1 or a logical 0.

11. A computing device according to claim 10 wherein activation of said word line is through said bit line in said decoder.

12. A computing device according to claim 1 wherein at least one cell connected to a bit line comprises only one memory cell in each column.

13. A computing device according to claim 1 wherein said at least one cell connected to a bit line comprises all the memory cells in each column.

14. A computing device according to claim 1 wherein said memory cells comprise non-destructive cells.

15. A computing device according to claim 1 wherein said memory cells comprise volatile memory cells.

16. A method of performing in-memory computations in a memory array comprising a plurality of sections having memory cells arranged in rows and column, at least one cell in each column of said memory array being connected to a bit line, the method comprising:
    connecting a bit line in a first column of a first section to a bit line in a second column in a second section different from said first section wherein said second column is not continuous with said first column; and
    activating at least two word lines of said first section and a word line connected to a cell in said second column in said second section to write a bit line voltage associated with a result of a logical operation performed on said first column into said cell in said second column.

17. A method according to claim 16 further comprising decompressing compressed data represented by a small size instruction set into a large size instruction set.

18. A method according to claim 16 further comprising simultaneously accessing a plurality of read word lines and write word lines.

19. A method according to claim 16 further comprising decoding an instruction set from a controller into an instruction set comprising a plurality of read and write commands.

20. A method according to claim 16 further comprising activating said word line with a bit line voltage.

* * * * *